(12) United States Patent
Cho et al.

(10) Patent No.: US 7,153,787 B2
(45) Date of Patent: Dec. 26, 2006

(54) CVD PLASMA ASSISTED LOWER DIELECTRIC CONSTANT SICOH FILM

(75) Inventors: Seon-Mee Cho, Santa Clara, CA (US); Peter Wai-Man Lee, San Jose, CA (US); Chi-I Lang, Sunnyvale, CA (US); Dian Sugiarto, Sunnyvale, CA (US); Chen-An Chen, Milpitas, CA (US); Li-Qun Xia, Santa Clara, CA (US); Shankar Venkataraman, Santa Clara, CA (US); Ellie Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 136 days.

(21) Appl. No.: 11/044,246

(22) Filed: Jan. 27, 2005

(65) Prior Publication Data
US 2005/0153572 A1    Jul. 14, 2005

Related U.S. Application Data

(63) Continuation of application No. 10/302,240, filed on Nov. 22, 2002, now Pat. No. 6,943,127, which is a continuation of application No. 09/885,985, filed on Jun. 18, 2001, now Pat. No. 6,486,082.

(51) Int. Cl.
*H01L 21/469* (2006.01)

(52) U.S. Cl. .................. 438/789; 438/778; 438/780

(58) Field of Classification Search .................. 438/789
See application file for complete search history.

(56) References Cited

U.S. PATENT DOCUMENTS

| | | | |
|---|---|---|---|
| 5,000,113 A | 3/1991 | Wang et al. | |
| 5,465,680 A | 11/1995 | Loboda | |
| 5,593,741 A | 1/1997 | Ikeda | |
| 5,598,027 A | 1/1997 | Matsuura | |
| 5,599,740 A | 2/1997 | Jang et al. | |
| 5,616,369 A | 4/1997 | Williams et al. | |
| 5,618,619 A | 4/1997 | Petrmichl et al. | |
| 5,637,351 A | 6/1997 | O'Neal et al. | |
| 5,638,251 A | 6/1997 | Goel et al. | |
| 5,679,413 A | 10/1997 | Petrmichl et al. | |
| 5,683,940 A | 11/1997 | Yahiro | |
| 5,693,563 A | 12/1997 | Teong | |
| 5,700,720 A | 12/1997 | Hashimoto | |

(Continued)

FOREIGN PATENT DOCUMENTS

DE    196 54 737 A1    7/1997

(Continued)

OTHER PUBLICATIONS

Stuardo Robles, et al., "Characterization of High Density Plasma Chemical Vapor Deposited α-Carbon and α-Fluorinated Carbon Films for Ultra Low Dielectric Application" Feb. 10-11, 1997 DUMIC Conference 1997 ISMIC—222D/97/0026, p. 26-33.
A. Hass Bar-Ilan, et al., "A Comparative Study of Sub-Micro Gap Filling and Planarization Techniques" Tower Semiconductor Ltd. Israel, SPIE vol. 2636, pp. 277-288, 2002.
European Search Report for EP 00112300.9-2203, dated Aug. 24, 2001.

(Continued)

*Primary Examiner*—Carl Whitehead, Jr.
*Assistant Examiner*—Colleen E. Rodgers
(74) *Attorney, Agent, or Firm*—Patterson and Sheridan

(57) ABSTRACT

A low dielectric constant film having silicon-carbon bonds and dielectric constant of about 3.0 or less, preferably about 2.5 or less, is provided. The low dielectric constant film is deposited by reacting a cyclic organosilicon compound and an aliphatic organosilicon compound with an oxidizing gas while applying RF power. The carbon content of the deposited film is between about 10 and about 30 atomic percent excluding hydrogen atoms, and is preferably between about 10 and about 20 atomic percent excluding hydrogen atoms.

20 Claims, 6 Drawing Sheets

U.S. PATENT DOCUMENTS

| | | | |
|---|---|---|---|
| 5,703,404 | A | 12/1997 | Matsuura |
| 5,739,579 | A | 4/1998 | Chiang et al. |
| 5,753,564 | A | 5/1998 | Fukada |
| 5,789,319 | A | 8/1998 | Havemann et al. |
| 5,800,877 | A | 9/1998 | Maeda et al. |
| 5,807,785 | A | 9/1998 | Ravi |
| 5,821,168 | A | 10/1998 | Jain |
| 5,834,162 | A | 11/1998 | Malba |
| 5,858,880 | A | 1/1999 | Dobson et al. |
| 5,874,367 | A | 2/1999 | Dobson |
| 5,888,593 | A | 3/1999 | Petrmichl et al. |
| 5,891,799 | A | 4/1999 | Tsui |
| 5,989,998 | A | 11/1999 | Sugahara et al. |
| 6,037,274 | A | 3/2000 | Kudo et al. |
| 6,051,321 | A | 4/2000 | Lee et al. |
| 6,054,206 | A | 4/2000 | Mountsier |
| 6,054,379 | A | 4/2000 | Yau et al. |
| 6,072,227 | A | 6/2000 | Yau et al. |
| 6,080,526 | A | 6/2000 | Yang et al. |
| 6,124,641 | A | 9/2000 | Matsuura |
| 6,140,226 | A | 10/2000 | Grill et al. |
| 6,147,009 | A | 11/2000 | Grill et al. |
| 6,258,735 | B1 * | 7/2001 | Xia et al. ............ 438/788 |
| 6,287,990 | B1 | 9/2001 | Cheung et al. |
| 6,303,523 | B1 | 10/2001 | Cheung et al. |
| 6,312,793 | B1 | 11/2001 | Grill et al. |
| 6,316,063 | B1 | 11/2001 | Andideh et al. |
| 6,352,945 | B1 | 3/2002 | Matsuki et al. |
| 6,383,955 | B1 | 5/2002 | Matsuki et al. |
| 6,413,583 | B1 | 7/2002 | Moghadam et al. |
| 6,437,443 | B1 | 8/2002 | Grill et al. |
| 6,441,491 | B1 | 8/2002 | Grill et al. |
| 6,479,110 | B1 | 11/2002 | Grill et al. |
| 6,486,082 | B1 | 11/2002 | Cho et al. |
| 6,537,929 | B1 | 3/2003 | Cheung et al. |
| 6,541,367 | B1 | 4/2003 | Mandal |
| 6,541,398 | B1 | 4/2003 | Grill et al. |
| 6,562,690 | B1 | 5/2003 | Cheung et al. |
| 6,583,048 | B1 | 6/2003 | Vincent et al. |
| 6,593,247 | B1 | 7/2003 | Huang et al. |
| 6,627,532 | B1 * | 9/2003 | Gaillard et al. ............ 438/623 |
| 6,632,478 | B1 | 10/2003 | Gaillard et al. |
| 6,852,650 | B1 | 2/2005 | Matsuki |
| 2001/0004479 | A1 | 6/2001 | Cheung et al. |
| 2001/0005546 | A1 | 6/2001 | Cheung et al. |
| 2001/0021590 | A1 | 9/2001 | Matsuki |
| 2001/0055672 | A1 | 12/2001 | Todd |
| 2002/0068458 | A1 | 6/2002 | Chiang et al. |
| 2002/0098714 | A1 | 7/2002 | Grill et al. |
| 2002/0187262 | A1 * | 12/2002 | Rocha-Alvarez et al. ............ 427/255.27 |
| 2003/0116421 | A1 | 6/2003 | Xu et al. |
| 2003/0162408 | A1 | 8/2003 | Matsuki et al. |
| 2004/0038514 | A1 | 2/2004 | Hyodo et al. |
| 2004/0039219 | A1 | 2/2004 | Chen et al. |
| 2005/0038276 | A1 | 2/2005 | Laxman et al. |

FOREIGN PATENT DOCUMENTS

| | | |
|---|---|---|
| DE | 198 04 375 A1 | 1/1999 |
| DE | 199 04 311 A1 | 8/1999 |
| EP | 0 711 817 A2 | 5/1996 |
| EP | 0 771 886 A1 | 5/1997 |
| EP | 0 774 533 A1 | 5/1997 |
| EP | 0 840 365 A2 | 5/1998 |
| EP | 0 849 789 A2 | 6/1998 |
| EP | 0 885 983 A1 | 12/1998 |
| EP | 0 096 715 A2 | 6/1999 |
| EP | 0 926 724 A2 | 6/1999 |
| EP | 1 037 275 A1 | 9/2000 |
| EP | 1 123 991 A2 | 8/2001 |
| GB | 2 316 535 A | 2/1998 |
| JP | 9-8031 | 1/1997 |
| JP | 9-064029 | 3/1997 |
| JP | 9-237785 | 9/1997 |
| JP | 9-251997 | 9/1997 |
| JP | 9-260369 | 10/1997 |
| JP | 10-242143 | 9/1998 |
| JP | 11-251293 | 9/1999 |
| WO | WO 94/01885 | 1/1994 |
| WO | WO 98/59089 | 12/1998 |
| WO | WO 99/08249 | 2/1999 |
| WO | WO 99/38202 | 7/1999 |
| WO | WO 99/41423 | 8/1999 |
| WO | WO 99/55526 | 11/1999 |
| WO | WO 00/01012 A1 | 1/2000 |
| WO | WO 01/01472 A1 | 1/2001 |
| WO | WO 02/43119 A2 | 5/2002 |

OTHER PUBLICATIONS

V. Hazari, et al., "Characterization of Alternative Chemistries for Depositing PECVD Silicon Dioxide Films" Novellus Systems, Inc., San Jose, CA, Feb. 16-17, 1998, pp. 319-326.

S. McClatchie, "Low Dielectric Constant Oxide Films Deposited Using CVD Techniques" Feb. 16-17, 1998 DUMIC Conference 1998 IMIC—333D/98/0311 pp. 311-318.

M.J. Loboda, et al., "Deposition of Low-k Dielectric Films Using Trimethylsilane" Electrochemical Society Proceedings vol. 98-6, pp. 145-152, 1999.

Bin Zhao, et al., "Integration of Low Dielectric Constant Materials In Advanced Aluminum and Copper Interconnects" Conexant Systems, 4311 Jamboree Road, Newport Beach, CA 92660, 1999, pp. 485-497.

Sugahara, et al., "Low Dielectric Constant Carbon Containing $SiO_2$ Films Deposited by PECVD Technique Using a Novel CVD Precursor" Feb. 10-11, 1997 DUMIC Conference, 1997 ISMIC—222D/97/0019, pp. 19-25.

Akiko Nara, et al., "Low Dielectric Constant Insulator Formed by Downstream Plasma CVD at Room Temperature Using $TMS/O_2$" ULSI Research Lab, accepted Nov. 14, 1996, pp. 1477-1480.

A. Grill, et al., "Diamondlike Carbon Materials as Low-k Dielectrics" 1997 Materials Research Society, pp. 417-423.

A. Grill, et al., "Novel Low-K Dielectrics Based on Diamondlike Carbon Materials", IBM, Research Division, T.J. Watson Research Center, Yorktown Heights, New York 10598, USA, pp. 1649-1653, 1997.

K.J. Taylor, et al, "Parylene Copolymers" SPDC, Texas Instruments, Inc., P.O. Box 3701, Dallas, TX 75265, 1997, pp. 1-9.

Y.S. Lin, et al. "Plasma Polymerization of Trimethylsilane in Cascade Arc Discharge" Department of Chemical Engineering, and Center for Surface Science and Plasma Technology, University of Missouri-Columbia, Received Jan. 15, 1997; accepted Feb. 4, 1997, pp. 1653-1665.

Laura Peters, "Pursuing the Perfect Low-K Dielectric" 64 Semiconductor International, Sep. 1998, 7 pages.

A. Grill, et al., "Low Dielectric Constant Films Prepared by Plasma-enhanced Chemical Vapor Deposition From Tetramethylsilane" IBM-Research Division, T.J. Watson Research Center, Yorktown Heights, New York 10598, pp. 3314-3318, 1999.

A.M. Wrobel, et al., "Reactivity of Alkylsilanes and Alkylcarbosilanes in Atomic Hydrogen-Induced Chemical Vapor Deposition" Polish Academy of Sciences, Centre of Molecular and Macromolecular Studies, 90-363 Lodz, Poland, pp. 1060-1065, 1998.

A. Grill, et al., "Diamondlike Carbon Materials As BEOL Interconnect Dielectrics: Integration Issues," Electrochemical Soc. Proceedings vol. 98-3, pp. 118-129, date unavailable.

M. J. Loboda, et al., "Using Trimethylsilane To Improve Safety, Throughput and Versatility in PECVD Processes," Electrochemical Proceedings vol. 97-10, pp. 443-453, date unavailable.

M. J. Loboda, et al., "Safe Precursor Gas For Broad Replacement of $Sih_4$ In Plasma Processes Employed In Integrated Circuit Production," Materials Research Soc. vol. 447, pp. 145-151, 1997.

* cited by examiner

CVD PLASMA ASSISTED LOWER DIELECTRIC CONSTANT SICOH FILM

RELATED APPLICATIONS

This application is a continuation of U.S. patent application Ser. No. 10/302,240, filed Nov. 22, 2002, now U.S. Pat. No. 6,943,127 which is a continuation of U.S. patent application Ser. No. 09/885,985, filed on Jun. 18, 2001, now issued as U.S. Pat. No. 6,486,082.

BACKGROUND OF THE INVENTION

1. Field of the Invention

The present invention relates to the fabrication of integrated circuits. More particularly, the invention relates to a process for depositing dielectric layers on a substrate and the structures formed by the dielectric layer.

2. Background of the Invention

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.13 μm and even 0.1 μm feature sizes, and tomorrow's plants soon will be producing devices having even smaller geometries.

In order to further reduce the size of devices on integrated circuits, it has become necessary to use conductive materials having low resistivity and to use insulators having low dielectric constants (k<4.0) to reduce the capacitive coupling between adjacent metal lines. One such low k material is spin-on glass, such as un-doped silicon glass (USG) or fluorine-doped silicon glass (FSG), which can be deposited as a gap fill layer in a semiconductor manufacturing process. Other examples of low k materials include silicon dioxide and polytetrafluoroethylene which are all commercially available. However, the continued reduction in device geometries has generated a demand for films having even lower k values.

Rose et al. (U.S. Pat. No. 6,068,884) discloses a method of depositing an insulator wherein a cyclic organosilicon compound, octamethylcylcotetrasiloxane (OMCTS), is partially fragmented to form both cyclic and chain structures in the deposited film. However, partially fragmenting cyclic precursors is difficult to control. Therefore, there is a need for a controllable process for making low dielectric constant materials that would improve the speed and efficiency of devices on integrated circuits.

SUMMARY OF THE INVENTION

The present invention provides a method for depositing a low dielectric constant film having a dielectric constant of about 3.0 or less, preferably about 2.5 or less. In one aspect, a cyclic organosilicon compound and an aliphatic organosilicon compound are reacted with an oxidizing gas at conditions sufficient to deposit a low dielectric constant film on the semiconductor substrate. The cyclic organosilicon compound comprises at least one silicon-carbon bond. The aliphatic organosilicon compound comprises a silicon-hydrogen bond or a silicon-oxygen bond.

In another aspect, a method for depositing a low dielectric constant film comprises flowing a cyclic organosilicon compound and an aliphatic organosilicon compound into a reaction zone at a volume ratio between about 1:4 and about 4:1, and reacting the compounds with an oxidizing gas while applying RF power to deposit a film having a dielectric constant of about 3 or less, preferably about 2.5 or less. The cyclic organosilicon compound comprises at least three silicon atoms and from one to two alkyl groups bonded to each silicon atom. The aliphatic organosilicon compound comprises at least one hydrogen or at least one alkoxy group bonded to at least one silicon atom. In another aspect, both the cyclic organosilicon compound and the aliphatic organosilicon compound comprise at least one silicon-hydrogen bond.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the description and appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
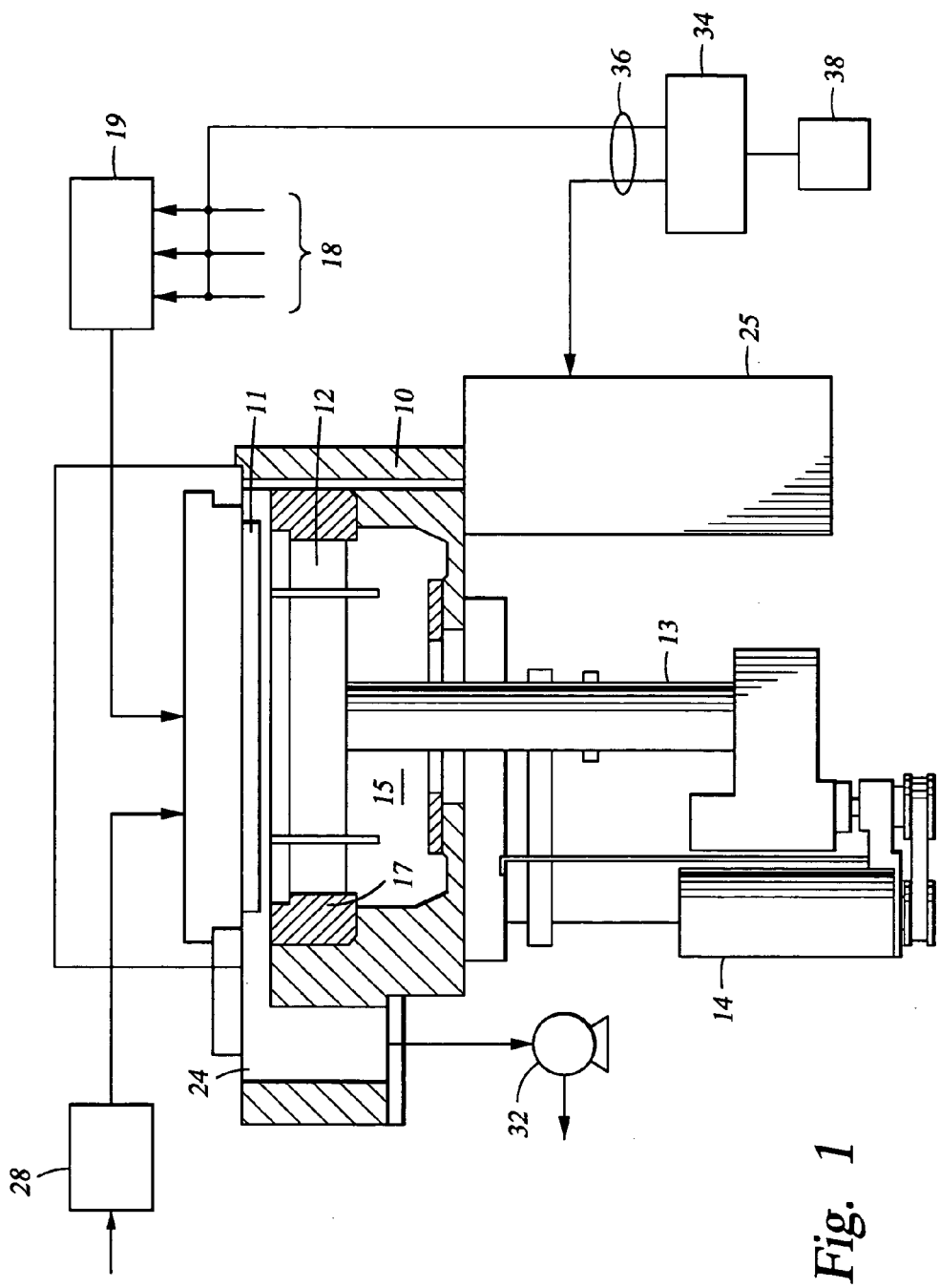
FIG. 1 is a a cross-sectional diagram of an exemplary CVD reactor configured for use according to embodiments described herein.

The present invention includes a significant and unexpected reduction in dielectric constants for films comprising silicon, oxygen, and carbon by blending both aliphatic organosilicon compounds and cyclic organosilicon compounds with an oxidizing gas at conditions sufficient to form a low dielectric constant film. The low dielectric constant film has a dielectric constant of about 3.0 or less, preferably about 2.5 or less. The films contain silicon-carbon bonds and the carbon content of the deposited film is between about 10 and about 30 atomic percent (excluding hydrogen atoms), preferably between about 10 and about 20 atomic percent.

Cyclic organosilicon compounds typically have a ring comprising three or more silicon atoms and the ring may further comprise one or more oxygen atoms. Commercially available cyclic organosilicon compounds include rings having alternating silicon and oxygen atoms with one or two alkyl groups bonded to the silicon atoms.

Aliphatic organosilicon compounds have linear or branched structures comprising one or more atoms and one or more silicon carbon atoms, and the structure may further comprise oxygen. Commercially available aliphatic organosilicon compounds include organosilanes that do not contain oxygen between silicon atoms and organosiloxanes which contain oxygen between two or more silicon atoms.

The carbon content of the deposited films refers to atomic analysis of the film structure which typically does not contain significant amounts of non-bonded hydrocarbons. The carbon contents are represented by the percent of carbon atoms in the deposited film, excluding hydrogen atoms which are difficult to quantify. For example, a film having an average of one silicon atom, one oxygen atom, one carbon atom and two hydrogen atoms has a carbon content of 20 atomic percent (one carbon atom per five total atoms), or a carbon content of 33 atomic percent excluding hydrogen atoms (one carbon atom per three total atoms).

Organosilicon compounds contain carbon atoms in organic groups. Low dielectric constant films are prepared from organosilicon compounds that have one or more carbon atoms attached to silicon wherein the carbon is not readily removed by oxidation at suitable processing conditions. Organic groups may include alkyl, alkenyl, cyclohexenyl, and aryl groups in addition to functional derivatives thereof.

Cyclic organosilicon compounds include, for example, one or more of the following compounds:

| | |
|---|---|
| 1,3,5-trisilano-2,4,6-trimethylene, | $-(-SiH_2CH_2-)_3-$ (cyclic) |
| 2,4,6,8-tetramethylcyclotetrasiloxane (TMCTS) | $-(-SiHCH_3-O-)_4-$ (cyclic) |
| octamethylcyclotetrasiloxane (OMCTS), | $-(-Si(CH_3)_2-O-)_4-$ (cyclic) |
| 2,4,6,8,10-pentamethylcyclopentasiloxane, | $-(-SiHCH_3-O-)_5-$ (cyclic) |
| 1,3,5,7-tetrasilano-2,6-dioxy-4,8-dimethylene, | $-(-SiH_2-CH_2-SiH_2-O-)_2-$ (cyclic) |
| hexamethylcyclotrisiloxane | $-(-Si(CH_3)_2-O-)_3-$ (cyclic) |

Aliphatic organosilicon compounds include for example, one or more of the following compounds:

| | |
|---|---|
| methylsilane, | $CH_3-SiH_3$ |
| dimethylsilane, | $(CH_3)_2-SiH_2$ |
| trimethylsilane, | $(CH_3)_3-SiH$ |
| dimethyldimethoxysilane, | $(CH_3)_2-Si-(OCH_3)_2$ |
| ethylsilane, | $CH_3-CH_2-SiH_3$ |
| disilanomethane, | $SiH_3-CH_2-SiH_3$ |
| bis(methylsilano)methane, | $CH_3-SiH_2-CH_2-SiH_2-CH_3$ |
| 1,2-disilanoethane, | $SiH_3-CH_2-CH_2-SiH_3$ |
| 1,2-bis(methylsilano)ethane, | $CH_3-SiH_2-CH_2-CH_2-SiH_2-CH_3$ |
| 2,2-disilanopropane, | $SiH_3-C(CH_3)_2-SiH_3$ |
| 1,3-dimethyldisiloxane, | $CH_3-SiH_2-O-SiH_2-CH_3$ |
| 1,1,3,3-tetramethyldisiloxane, | $(CH_3)_2-SiH-O-SiH-(CH_3)_2$ |
| hexamethyldisiloxane (HMDS), | $(CH_3)_3-Si-O-Si-(CH_3)_3$ |
| 1,3-bis(silanomethylene)disiloxane, | $(SiH_3-CH_2-SiH_2-)_2O$ |
| bis(1-methyldisiloxanyl)methane, | $(CH_3-SiH_2-O-SiH_2-)_2CH_2$ |
| 2,2-bis(1-methyldisiloxanyl)propane, | $(CH_3-SiH_2-O-SiH_2-)_2C(CH_3)_2$ |
| hexamethoxydisiloxane (HMDOS) | $(CH_3O)_3-Si-O-Si-(OCH_3)_3$ |

In one aspect, a cyclic organosilicon compounds and an aliphatic organosilicon compound are reacted with an oxidizing gas in amounts sufficient to deposit a low dielectric constant film on a semiconductor substrate, wherein the cyclic organosilicon compound comprises at least one silicon-carbon bond. The aliphatic organosilicon compound contains a silicon-hydrogen bond or a silicon-oxygen bond, preferably a silicon-hydrogen bond. For example, the cyclic organosilicon compound may be 2,4,6,8-tetramethylcyclotetrasiloxane or octamethylcyclotetrasiloxane and the aliphatic organosilicon compound may be trimethylsilane or 1,1,3,3-tetramethyldisiloxane.

In another aspect, both the cyclic organosilicon compound and the aliphatic organosilicon compound contain a silicon-hydrogen bond. For example, 2,4,6,8-tetramethylcyclotetrasiloxane and trimethylsilane or 1,1,3,3-tetramethyldisiloxane are blended and oxidized while applying RF power.

Although a post cure is not necessary, the low dielectric constant film may be annealed to reduce the moisture content, such as after exposure to ambient air. For example, the film may be subjected to a temperature between about 100° C. and about 400° C. for between about 1 minute and about 60 minutes, preferably about 30 minutes.

Oxygen and oxygen containing compounds may be dissociated to increase reactivity and achieve the desired carbon content in the deposited film. For example, organosilicon compounds not containing oxygen may be oxidized by reaction with oxygen ($O_2$), ozone ($O_3$), nitrous oxide ($N_2O$), carbon monoxide (CO), carbon dioxide ($CO_2$), water ($H_2O$), or combinations thereof, preferably oxygen. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the amount of ozone desired and the type of ozone generating equipment used. Disassociation of oxygen or the oxygen containing compounds may occur in a microwave chamber prior to entering the deposition chamber to reduce excessive dissociation of the silicon containing compounds. Preferably, radio frequency (RF) power is applied to the reaction zone to increase dissociation.

Deposition of the low dielectric constant film can be continuous or discontinuous. Although deposition preferably occurs in a single deposition chamber, the film can be deposited sequentially in two or more deposition chambers. During deposition, the substrate is maintained at a temperature between about −20° C. and about 400° C., and preferably is maintained at a temperature between about 170° C. and about 450° C. RF power may be cycled or pulsed to reduce heating of the substrate and promote greater porosity in the deposited film. For a plasma enhanced deposition, the low dielectric constant film is deposited using a power density ranging between about 0.03 W/cm$^2$ and about 3.2 W/cm$^2$, which is a RF power level of between about 10 W and about 2000 W for a 200 mm substrate. Preferably, the RF power level is between about 300 W and about 1700 W. The RF power is provided at a frequency between about 0.01 MHz and 300 MHz. The RF power may be provided continuously or in short duration cycles wherein the power is on at the stated levels for cycles less than about 200 Hz and the on cycles total between about 10% and about 50% of the total duty cycle. The deposition process of the low dielectric constant film is performed in a substrate processing system described in more detail below.

Exemplary CVD Reactor

FIG. 1 shows a vertical, cross-section view of a parallel plate chemical vapor deposition processing chamber 10 having a high vacuum region 15. The processing chamber 10 contains a gas distribution manifold 11 having perforated holes for dispersing process gases there-through to a substrate (not shown). The substrate rests on a substrate support plate or susceptor 12. The susceptor 12 is mounted on a support stem 13 which connects the susceptor 12 to a lift motor 14. The lift motor 14 raises and lowers the susceptor 12 between a processing position and a lower, substrate-loading position so that the susceptor 12 (and the substrate supported on the upper surface of susceptor 12) can be controllably moved between a lower loading/off-loading position and an upper processing position which is closely adjacent to the manifold 11. When the susceptor 12 and the substrate are in the upper processing position 14, they are surrounded by an insulator 17.

During processing, gases introduced to the manifold 11 are uniformly distributed radially across the surface of the substrate. A vacuum pump 32 having a throttle valve controls the exhaust rate of gases from the chamber through a manifold 24. Deposition and carrier gases flow through gas lines 18 into a mixing system 19 and then to the manifold 11. Generally, each process gas supply line 18 includes (i) safety shut-off valves (not shown) that can be used to automatically or manually shut off the flow of process gas into the chamber, and (ii) mass flow controllers (also not shown) to measure the flow of gas through the gas supply lines 18. When toxic gases are used in the process, several safety shut-off valves are positioned on each gas supply line 18 in conventional configurations.

The deposition process performed in the processing chamber 10 can be either a thermal process or a plasma enhanced process. In a plasma process, a controlled plasma is typically formed adjacent the substrate by RF energy applied to the gas distribution manifold 11 using a RF power supply 25. Alternatively, RF power can be provided to the susceptor 12 or RF power can be provided to different components at different frequencies. The RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12.

When additional dissociation of the oxidizing gas is desired, an optional microwave chamber 28 can be used to input from between about 0 Watts and about 6000 Watts to the oxidizing gas prior to the gas entering the processing chamber 10. The additional microwave power can avoid excessive dissociation of the organosilicon compounds prior to reaction with the oxidizing gas. A gas distribution plate (not shown) having separate passages for the organosilicon compound and the oxidizing gas is preferred when microwave power is added to the oxidizing gas.

Typically, any or all of the chamber lining, distribution manifold 11, susceptor 12, and various other reactor hardware is made out of material such as aluminum or anodized aluminum. An example of such a CVD reactor is described in U.S. Pat. No. 5,000,113, entitled A Thermal CVD/PECVD Reactor and Use for Thermal Chemical Vapor Deposition of Silicon Dioxide and In-situ Multi-step Planarized Process, issued to Wang et al. and assigned to Applied Materials, Inc., the assignee of the present invention.

A system controller 34 controls the motor 14, the gas mixing system 19, and the RF power supply 25 which are connected therewith by control lines 36. The system controller 34 controls the activities of the CVD reactor and typically includes a hard disk drive, a floppy disk drive, and a card rack. The card rack contains a single board computer (SBC), analog and digital input/output boards, interface boards, and stepper motor controller boards. The system controller 34 conforms to the Versa Modular Europeans (VME) standard which defines board, card cage, and connector dimensions and types. The VME standard also defines the bus structure having a 16-bit data bus and 24-bit address bus.

Figure 2:
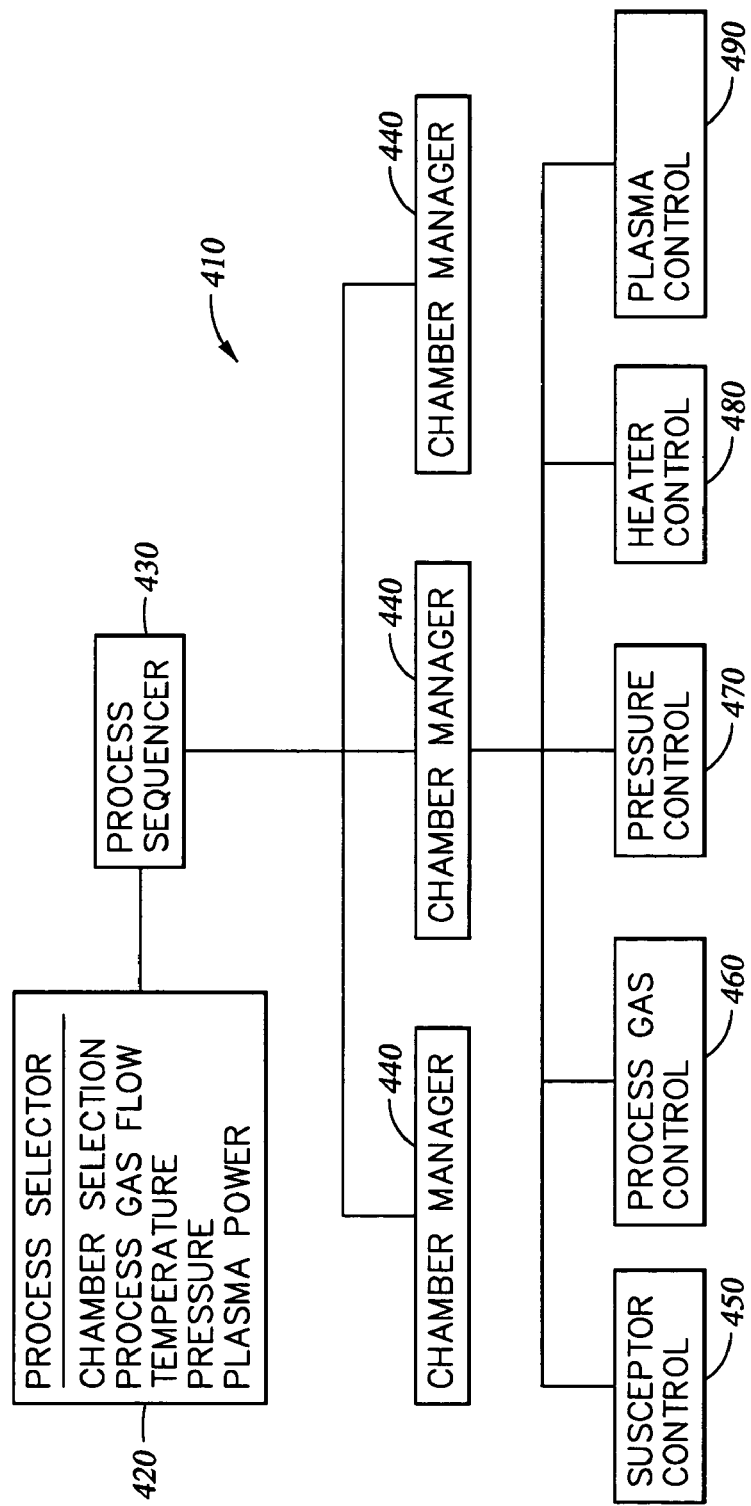
FIG. 2 is a flow chart of a process control computer program product used in conjunction with the exemplary CVD reactor of FIG. 1.

Referring to FIG. 2, the system controller 34 Operates under the control of a computer program 410 stored on the hard disk drive 38. The computer program dictates the timing, mixture of gases, RF power levels, susceptor position, and other parameters of a particular process. The computer program code can be written in any conventional computer readable programming language such as, for example, 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of pre-compiled windows library routines. To execute the linked compiled object code, the system user invokes the object code, causing the computer system to load the code in memory, from which the CPU reads and executes the code to perform the tasks identified in the program.

FIG. 2 shows an illustrative block diagram of the hierarchical control structure of the computer program 410. A user enters a process set number and process chamber number into a process selector subroutine 420 in response to menus or screens displayed on the CRT monitor by using the light pen interface. The process sets are predetermined sets of process parameters necessary to carry out specified processes, and are identified by predefined set numbers. The process selector subroutine 420 (i) selects a desired process chamber on a cluster tool such as an Centura® platform (available from Applied Materials, Inc.), and (ii) selects a desired set of process parameters needed to operate the process chamber for performing the desired process. The process parameters for performing a specific process are provided to the user in the form of a recipe and relate to process conditions such as, for example, process gas composition, flow rates, temperature, pressure, plasma conditions such as RF bias power levels and magnetic field power levels, cooling gas pressure, and chamber wall temperature. The parameters specified by the recipe are entered utilizing the light pen/CRT monitor interface. The signals for monitoring the process are provided by the analog input and digital input boards of the system controller 34 and the signals for controlling the process are output to the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling a process execute, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber according to the process set determined by the sequencer subroutine 430. For example, the chamber manager subroutine 440 includes program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in a processing chamber.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 450 comprises program code for controlling chamber components that are used to load the substrate onto the susceptor 12, and optionally to lift the substrate to a desired height in the processing chamber 10 to control the spacing between the substrate and the gas distribution manifold 11. When a substrate is loaded into the processing chamber 10, the susceptor 12 is lowered to receive the substrate, and thereafter, the susceptor 12 is raised to the desired height in the chamber to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440.

The process gas control subroutine 460 has program code for controlling process gas compositions and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as helium or argon is put into the processing chamber 10 to stabilize the pressure in the chamber before reactive process gases are introduced. For these processes, the process gas control subroutine 460 is programmed to include steps for flowing the inert gas into the chamber 10 for an amount of time necessary to stabilize the pressure in the chamber, and then the steps described above would be carried out. Additionally, when a process gas is to be vaporized from a liquid precursor, the process gas control subroutine 460 would be written to include steps for bubbling a delivery gas such as helium through the liquid precursor in a bubbler assembly. For this type of process, the process gas control subroutine 460 regulates the flow of the delivery gas, the pressure in the bubbler, and the bubbler temperature in order to obtain the desired process gas flow rates. As discussed above, the desired process gas flow rates are transferred to the process gas control subroutine 460 as process parameters. Furthermore, the process gas control subroutine 460 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 470 comprises program code for controlling the pressure in the processing chamber 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the processing chamber 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the processing chamber 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the processing chamber 10 is not properly set up.

The plasma control subroutine 490 comprises program code for setting the RF bias voltage power level applied to the process electrodes in the processing chamber 10, and optionally, to set the level of the magnetic field generated in the reactor. Similar to the previously described chamber component subroutines, the plasma control subroutine 490 is invoked by the chamber manager subroutine 440.

The pretreatment and method for forming a pretreated layer of the present invention is not limited to any specific apparatus or to any specific plasma excitation method. The above CVD system description is mainly for illustrative purposes, and other CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor.

Deposition of a Low Dielectric Constant Film

Figure 3:
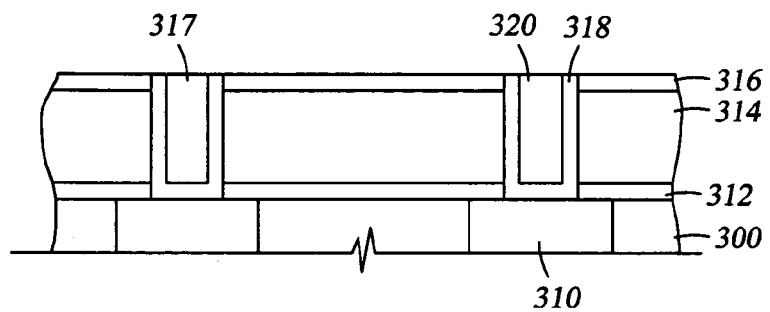
FIG. 3 is a cross sectional view showing a damascene structure comprising a low dielectric constant film as described herein.

FIG. 3 shows a damascene structure having a low dielectric constant film of the present invention deposited thereon. The low dielectric constant film is deposited as a dielectric layer 314 on a dielectric liner or barrier layer 312. A cap layer 316 is deposited on the dielectric layer 314. The cap layer 316 acts as an etch stop during further substrate processing or alternatively, as a liner layer. The cap layer 316, dielectric layer 314, and dielectric liner or barrier layer 312 are pattern etched to define the openings of interconnects 317 such as lines that expose underlying conducive features 310. A conductive liner/barrier layer 318 is deposited within the interconnects 317, and a conductive material 320 is deposited thereon to fill the interconnects 317. The substrate is typically planarized, as shown, after deposition.

Figure 4A:
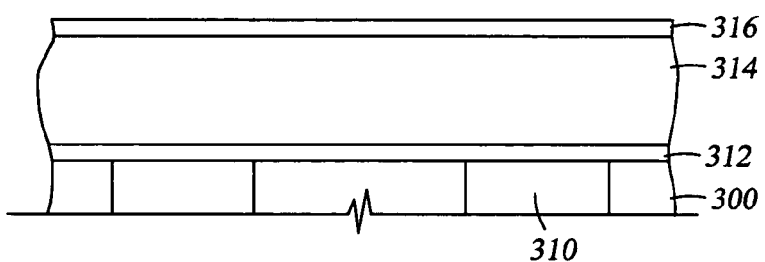
FIGS. 4A–4C are cross sectional views showing one embodiment of a damascene deposition sequence.
Figure 4B:
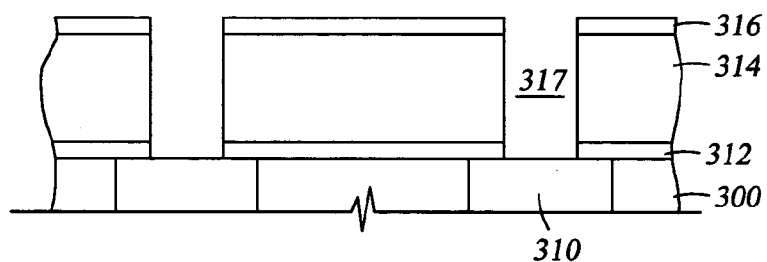
Figure 4C:
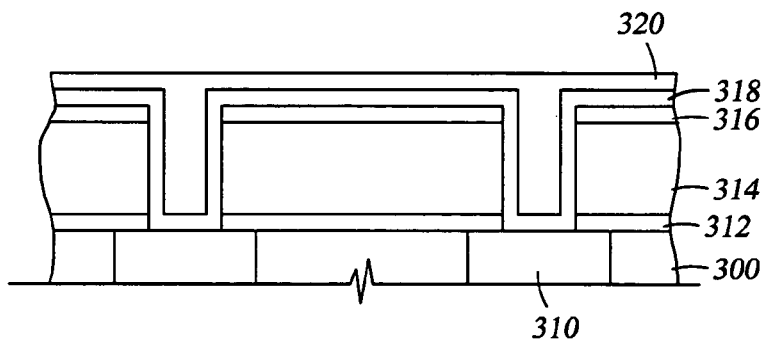

FIGS. 4A–4C are cross sectional views of a substrate 300 having the steps of the invention formed thereon. As shown in FIG. 4A, a dielectric layer 314 of the low dielectric constant film formed from two or more organosilicon compounds as described in subsequent examples is deposited on the liner or barrier layer 312 to a thickness between about 5,000 Å to about 10,000 Å, depending on the size of the structure to be fabricated. The liner or barrier layer 312 may be a silicon carbide layer, for example, from the PECVD of an alkylsilane compound using a plasma of an inert gas. The silicon carbide layer may be doped with oxygen or nitrogen. The liner/barrier layer 312 may alternatively comprise another material, such as silicon nitride, which minimizes oxidation and/or diffusion of conductive materials, such as copper, which may comprise conductive features 310 previously formed in the substrate 300.

The cap layer 316, which can be a silicon carbide layer have a low dielectric constant, is then deposited on the dielectric layer 314 by reaction of the trimethylsilane to a thickness of about 200 A to about 1000 Å using RF power in the range between about 10 and about 1000 watts for a 200 mm substrate. The silicon carbide material may be doped with oxygen or nitrogen.

As shown in FIG. 4B, the cap layer 316, the dielectric layer 314, and the liner or barrier layer 312 are then pattern etched to define the interconnects 317 and to expose the conductive feature 310 in substrate 300. Preferably, the cap layer 316, the dielectric layer 314, and the liner or barrier layer 312 are pattern etched using conventional photolithography and etch processes for silicon carbide films. Any photo resist or other material used to pattern the cap layer 316 is removed using an oxygen strip or other suitable process.

Following etching of the deposited material and removal of photo resist materials, exposed portions of the cap layer 316, the dielectric layer 314, and the liner or barrier layer 312 may be treated with a reactive pre-clean process to remove contaminants, particulate matter, residues, and oxides that may have formed on the exposed portions of the interconnects 317 and on the surface of the substrate. The reactive pre-clean process comprises exposing the substrate to a plasma, preferably comprising hydrogen, argon, helium, nitrogen, or mixtures thereof, at a power density between of 0.03 watts/cm$^2$ and about 3.2 watts/cm$^2$, or at a power level between about 10 watts and 1000 for a 200 millimeter substrate. The processing chamber is maintained at a pressure of about 20 Torr or less and at a substrate temperature of about 450° C. or less during the reactive clean process.

Referring to FIG. 4C, after the cap layer 316, the dielectric layer 314, and the liner or barrier layer 312 have been etched to define the interconnects 317 and the photo resist has been removed, the interconnects 317 are filled with a conductive material 320. The structure is preferably formed with a conductive material such as aluminum, copper, tungsten, or combinations thereof. Presently, the trend is to use copper to form the smaller features due to the low resistivity of copper (1.7 Ω-cm compared to 3.1 Ω-cm for aluminum).

Preferably, the conductive barrier layer 318 is first deposited conformably in the interconnects 317 to prevent copper migration into the surrounding silicon and/or dielectric material. Barrier layers include titanium, titanium nitride, tantalum, tantalum nitride, and combinations thereof among other conventional barrier layer materials. Thereafter, copper 320 is deposited using chemical vapor deposition, physical vapor deposition, electroplating, or combinations thereof, to form the conductive structure. Once the structure has been filled with copper or other conductive material, the surface is planarized using chemical mechanical polishing to produce the finished damascene structure shown in FIG. 3.

Figure 5:
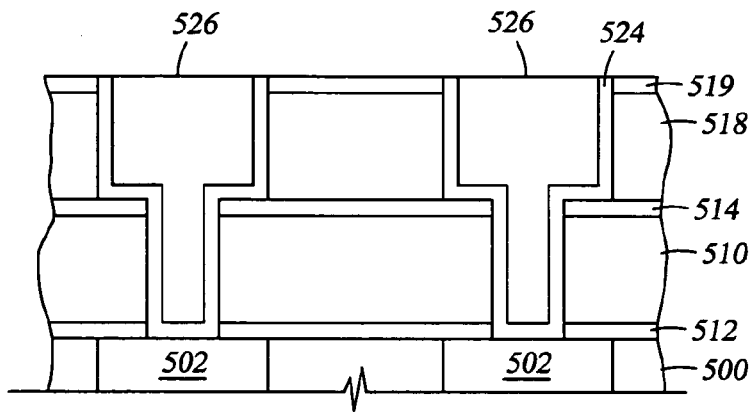
FIG. 5 is a cross sectional view showing a dual damascene structure comprising two low dielectric constant films as described herein.

A dual damascene structure which includes two low dielectric constant films and two silicon carbide cap layers or doped silicon carbide cap layers deposited thereon is shown in FIG. 5. A conductive feature 502 is formed in a substrate 500. The first low dielectric constant film is deposited as a first dielectric layer 510 on a liner or barrier layer 512, for example, silicon carbide. A first silicon carbide cap layer 514 is deposited on the first dielectric layer 510. The silicon carbide cap layer 514 reduces the dielectric constant of the low dielectric constant film and is pattern etched to define the openings of vertical interconnects such as contacts/vias. For the dual damascene application, a second dielectric layer 518 comprising the second low dielectric constant film is deposited over the patterned silicon carbide cap layer 514. The second silicon carbide cap layer 519 is deposited on the second dielectric layer 518 and pattern etched to define horizontal interconnects such as lines. An etch process is performed to define the horizontal interconnects down to the first silicon carbide layer 314 which functions as an etch stop, and to define the vertical interconnects and expose the conductive feature 502 in substrate 500 prior to filling the interconnects with a conductive material 526.

Figure 6A:
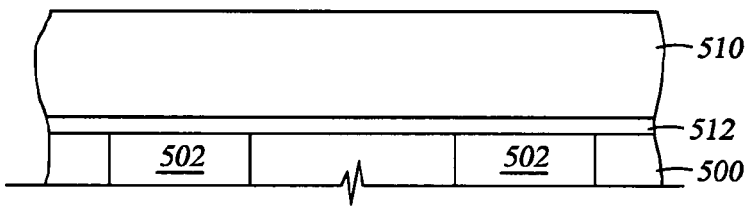
FIGS. 6A–6G are cross sectional views showing one embodiment of a dual damascene deposition sequence.

A preferred method for making the dual damascene structure shown in FIG. 5 is sequentially depicted in FIGS. 6A–6E, which are cross sectional views of a substrate having the steps of the invention formed thereon. As shown in FIG. 6A, an initial first dielectric layer 510 of the low dielectric constant film is deposited on the liner or barrier layer 512 to a thickness between about 5,000 Å and about 10,000 Å, depending on the size of the structure to be fabricated. The liner layer 512 may be a silicon carbide layer which may be doped with oxygen or nitrogen. The liner/barrier layer 512 may alternatively comprise another material, such as silicon nitride, which minimizes oxidation and/or diffusion of conductive materials, such as copper, which may comprise conductive features 502 previously formed in the substrate 500.

Figure 6B:
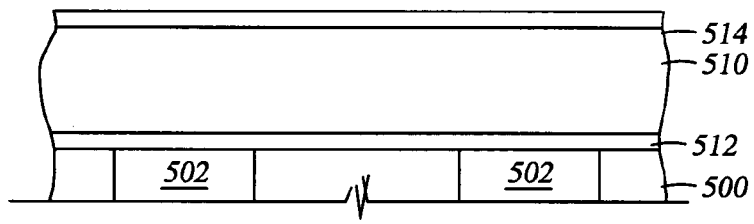
Figure 6C:
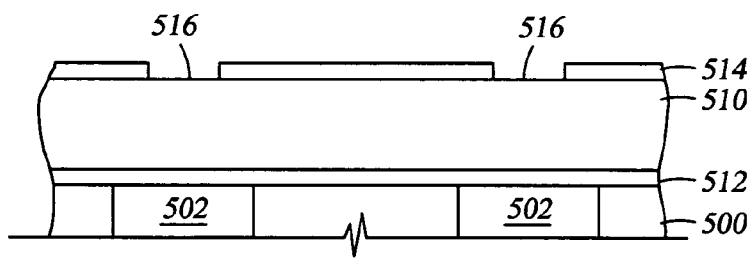

As shown in FIG. 6B, the first cap layer 514, which includes a silicon carbide layer or doped silicon carbide layer is then deposited on the first dielectric layer to a thickness between about 200 and about 1000 Å using RF power in the range between about 10 and about 1000 watts for a 200 mm substrate. The first cap layer 514 is then pattern etched to define the contact/via openings 516 and to expose first dielectric layer 510 in the areas where the contacts/vias are to be formed as shown in FIG. 6C. Preferably, the first cap layer 514 is pattern etched using conventional photolithography and etch processes for silicon carbide films.

Figure 6D:
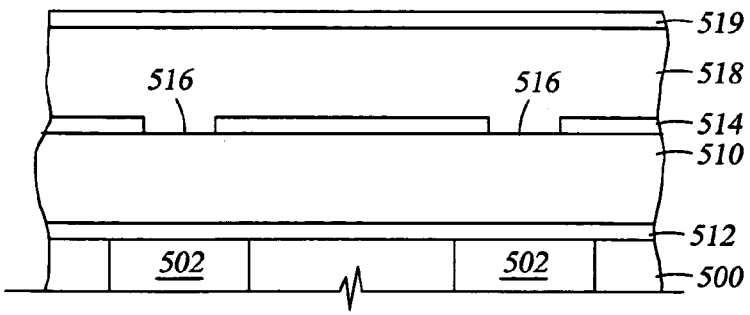

After the first cap layer 514 has been etched to pattern the contacts/vias 516 and the photo resist has been removed, a second dielectric layer 518 is deposited over the first cap layer 514 to a thickness between about 5,000 Å and about 10,000 Å as described for the first dielectric layer 510 as shown in FIG. 6D.

Figure 6E:
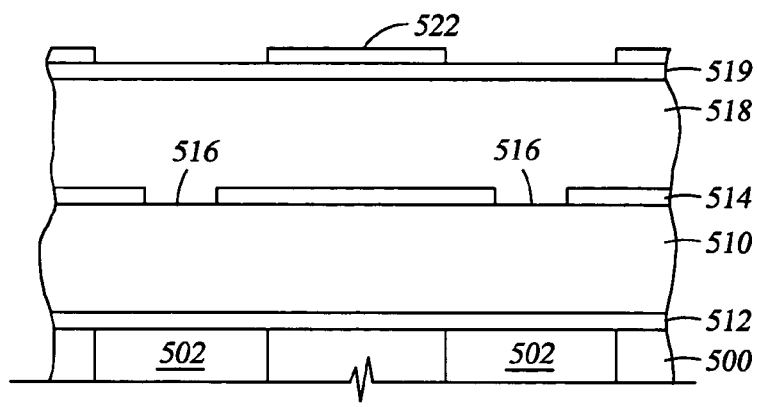
Figure 6F:
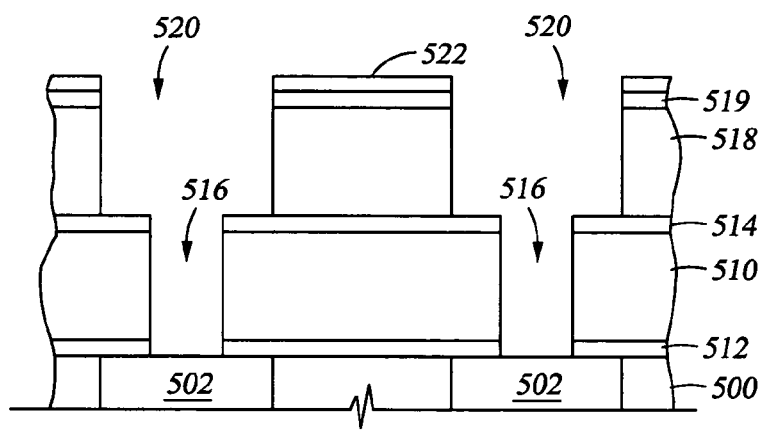

A second cap layer 519, which includes a silicon carbide layer or doped silicon carbide layer is then deposited on the second dielectric layer 518 to a thickness of about 200 to about 1000 Å. The silicon carbide material may be doped with oxygen or nitrogen. The second cap layer 519 is then patterned to define lines 520, as shown in FIG. 6E. The lines 520 and contacts/vias 516 are then etched using reactive ion etching or other anisotropic etching techniques to define the metallization structure (i.e., the openings for the lines and contact/via) and expose the conductive feature 502 as shown in FIG. 6F. Any photo resist or other material used to pattern and etch the second cap layer 519 is removed using an oxygen strip or other suitable process.

Following etching of the deposited material and removal of photo resist materials, exposed portions of the second cap layer 519, the second dielectric layer 518, the first cap layer 514, the first dielectric layer 510, and the liner or barrier layer 512 may be treated with a reactive pre-clean process, as described above, to remove contaminants, particulate matter, residues, and oxides that may have formed on the exposed portions of the contact/via openings 516, the line openings 520, and the conductive feature 502.

Figure 6G:
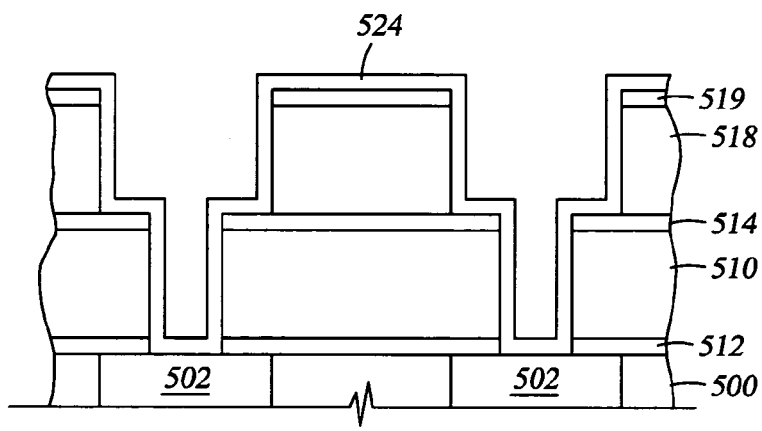

The metallization structure is then formed with a conductive material such as aluminum, copper, tungsten or combinations thereof. Presently, the trend is to use copper to form the smaller features due to the low resistivity of copper (1.7 Ω-cm compared to 5.1 Ω-cm for aluminum). Preferably, as shown in FIG. 6G, a conductive barrier layer 524 is first deposited conformally in the metallization pattern to prevent copper migration into the surrounding silicon and/or dielectric material. Barrier layers include titanium, titanium nitride, tantalum, tantalum nitride, and combinations thereof among other conventional barrier layer materials. Thereafter, copper 526 is deposited using either chemical vapor deposition, physical vapor deposition, electroplating, or combinations thereof to form the conductive structure. Once the structure has been filled with copper or other metal, the surface is planarized using chemical mechanical polishing as shown in FIG. 5.

EXAMPLES

The following examples illustrate the low dielectric films of the present invention. The films were deposited using a chemical vapor deposition chamber. In particular, the films were deposited using a "CENTURA DxZ" system. The system is fabricated and sold by Applied Materials, Inc. of Santa Clara, Calif.

Example 1

A low dielectric constant film was deposited on a substrate from the following reactive gases at a chamber pressure of 9 Torr and temperature of 350° C.
  Octamethylcyclotetrasiloxane (OMCTS), at 136 sccm (1800 mg/min);
  Trimethylsilane (TMS), at 50 sccm;
  Oxygen, at 50 sccm; and
  Helium, at 500 sccm
  The substrate was positioned 500 mm from the gas distribution showerhead. A power level of 1300 W at a frequency of 13.56 MHz was applied to the showerhead for plasma enhanced deposition of the film. The film was deposited at a rate of about 12,438 A/min, and had a dielectric constant (k) of about 2.65 measured at 0.1 MHz.

Example 2

A low dielectric constant film was deposited on a substrate from the following reactive gases at a chamber pressure of 9 Torr and temperature of 350° C.
  Octamethylcyclotetrasiloxane (OMCTS), at 136 sccm (1800 mg/min);
  Trimethylsilane (TMS), at 150 sccm;
  Oxygen, at 50 sccm; and
  Helium, at 500 sccm
  The substrate was positioned 500 mm from the gas distribution showerhead. A power level of 1300 W at a frequency of 13.56 MHz was applied to the showerhead for plasma enhanced deposition of the film. The film was deposited at a rate of about 9,940 A/min, and had a dielectric constant (k) of about 2.60 measured at 0.1 MHz.

Example 3

A low dielectric constant film was deposited on a substrate from the following reactive gases at a chamber pressure of 9 Torr and temperature of 350° C.
  Octamethylcyclotetrasiloxane (OMCTS), at 136 sccm (1800 mg/min);
  Trimethylsilane (TMS), at 450 sccm;
  Oxygen, at 50 sccm; and
  Helium, at 500 sccm
  The substrate was positioned 500 mm from the gas distribution showerhead. A power level of 1300 W at a frequency of 13.56 MHz was applied to the showerhead for plasma enhanced deposition of the film. The film was deposited at a rate of about 8,110 A/min, and had a dielectric constant (k) of about 2.56 measured at 0.1 MHz.

Example 4

A low dielectric constant film was deposited on a substrate from the following reactive gases at a chamber pressure of 9 Torr and temperature of 350° C.
Octamethylcyclotetrasiloxane (OMCTS), at 136 sccm (1800 mg/min);
Trimethylsilane (TMS), at 350 sccm;
Oxygen, at 50 sccm; and
Helium, at 500 sccm The substrate was positioned 500 mm from the gas distribution showerhead. A power level of 1300 W at a frequency of 13.56 MHz was applied to the showerhead for plasma enhanced deposition of the film. The film was deposited at a rate of about 7,495 A/min, and had a dielectric constant (k) of about 2.69 measured at 0.1 MHz.

Example 5

A low dielectric constant film was deposited on a substrate from the following reactive gases at a chamber pressure of 14 Torr and temperature of 350° C.
Octamethylcyclotetrasiloxane (OMCTS), at 113 sccm (1500 mg/min);
Trimethylsilane (TMS), at 300 sccm;
Oxygen, at 300 sccm; and
Helium, at 500 sccm A power level of 800 W at a frequency of 13.56 MHz was applied to the showerhead for plasma enhanced deposition of the film. The deposited film had a dielectric constant (k) between about 2.45 and about 2.58 measured at 0.1 MHz.

Comparison Example 1

A low dielectric constant film was deposited on a substrate from the following reactive gases at a chamber pressure of 9 Torr and temperature of 350° C.
Octamethylcyclotetrasiloxane (OMCTS), at 113 sccm (1500 mg/min);
Oxygen, at 300 sccm; and
Helium, at 500 sccm A power level of 800 W at a frequency of 13.56 MHz was applied to the showerhead for plasma enhanced deposition of the film. The deposited film had a dielectric constant (k) of about 2.68 measured at 0.1 MHz.

Figure 7:
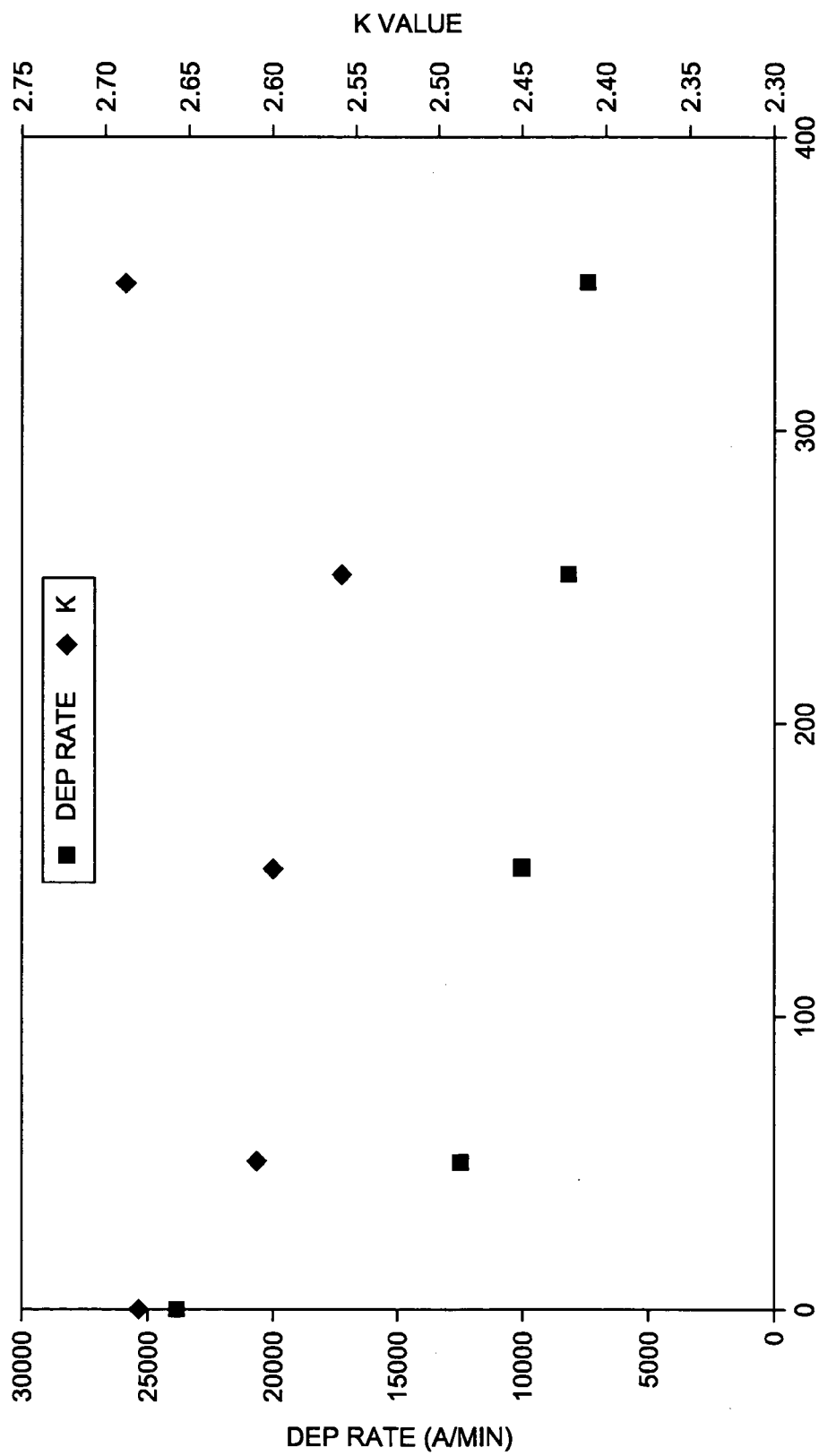
FIG. 7 shows a relationship between dielectric constant and ratio of gases.

FIG. 7 illustrates the effect of varying the flow rate of TMS in Examples 1–5 described above. It was surprisingly found that the deposition rate and the dielectric constant decreased as the flow rate of TMS increased between about 50 sccm and less than about 350 sccm. As shown in FIG. 7, the dielectric constant increased at about 350 sccm of TMS, while the deposition rate decreased. The low dielectric constants were achieved with a ratio of cyclic organosilicon compound to aliphatic organosilicon compound ranging from about 1:4 to about 4:1. As illustrated with the comparative example 1 and shown in FIG. 7, the addition of a sufficient amount of the aliphatic organosilicon compound and oxygen to the cyclic organosilicon compound provided a dielectric constant at least 5% lower than a dielectric constant obtained by omitting the aliphatic organosilicon compound.

While the foregoing is directed to preferred embodiments of the present invention, other and further embodiments of the invention may be devised without departing from the basic scope thereof, and the scope thereof is determined by the claims which follow.

What is claimed is:

1. A method for depositing a low dielectric constant film, comprising reacting an organosilicon compound comprising at least one alkoxy group and a cyclic organosiloxane with an oxidizing gas at conditions sufficient to deposit a low dielectric constant film on a substrate.

2. The method of claim 1, wherein the cyclic organosiloxane is selected from the group consisting of 1,3,5,7-tetramethylcyclotetrasiloxane, 1,3,5,7,9-pentamethylcyclopentasiloxane, octamethylcyclotetrasiloxane, 1,3,5,7-tetrasilano-2,6-dioxy-4,8-dimethylene, and hexamethylcyclotrisiloxane.

3. The method of claim 1, wherein the oxidizing gas comprises carbon dioxide.

4. The method of claim 3, wherein the oxidizing gas further comprises oxygen.

5. The method of claim 1, wherein the oxidizing gas comprises oxygen ($O_2$).

6. The method of claim 1, wherein the conditions comprise applying RF power.

7. The method of claim 1, further comprising annealing the low dielectric constant film.

8. The method of claim 1, wherein the film comprises silicon-carbon bonds.

9. A method for depositing a low dielectric constant film, comprising reacting an aliphatic organosilicon compound comprising at least one alkoxy group and a cyclic organosiloxane with an oxidizing gas at conditions sufficient to deposit a low dielectric constant film on a substrate.

10. The method of claim 9, wherein the aliphatic organosilicon compound comprises a silicon-oxygen bond.

11. The method of claim 9, wherein the aliphatic organosilicon compound is selected from the group consisting of dimethyldimethoxysilane and hexamethoxydisiloxane.

12. The method of claim 9, wherein the cyclic organosiloxane is selected from the group consisting of 1,3,5,7-tetramethylcyclotetrasiloxane and octamethylcyclotetrasiloxane.

13. The method of claim 9, wherein the oxidizing gas comprises carbon dioxide.

14. The method of claim 9, wherein the oxidizing gas comprises oxygen ($O_2$).

15. A method for depositing a low dielectric constant film, comprising reacting an aliphatic organosilicon compound comprising two alkoxy groups and octamethylcyclotetrasiloxane with an oxidizing gas at conditions sufficient to deposit a low dielectric constant film on a substrate.

16. The method of claim 15, wherein the aliphatic organosilicon compound further comprises a methyl group.

17. The method of claim 16, wherein the aliphatic organosilicon compound is dimethyldimethoxysilane.

18. The method of claim 15, wherein the oxidizing gas comprises carbon dioxide.

19. The method of claim 15, wherein the oxidizing gas comprises oxygen ($O_2$).

20. The method of claim 15, further comprising annealing the low dielectric constant film.

* * * * *